United States Patent

Ikada

[11] Patent Number: 5,936,483
[45] Date of Patent: Aug. 10, 1999

[54] SURFACE ACOUSTIC WAVE DEVICE WITH TWO FILTERS EACH HAVING CAPACITIVE IMPEDANCE IN THE OTHER'S PASSBAND

[75] Inventor: Katsuhiro Ikada, Kanazawa, Japan

[73] Assignee: Murata Manufacturing Co., Ltd., Kyoto, Japan

[21] Appl. No.: 09/131,590

[22] Filed: Aug. 10, 1998

[30] Foreign Application Priority Data

Aug. 22, 1997 [JP] Japan ................................ 9-225909

[51] Int. Cl.⁶ .................................................... H03H 9/72
[52] U.S. Cl. ........................................ 333/133; 333/195
[58] Field of Search .................................. 333/193–196, 333/133; 310/313 R, 313 B, 313 C, 313 D

[56] References Cited

U.S. PATENT DOCUMENTS

| 5,521,453 | 5/1996 | Yatsuda ............................... 333/193 X |
| 5,694,096 | 12/1997 | Ushiroku et al. ................... 333/193 X |
| 5,717,367 | 2/1998 | Murai ...................................... 333/195 |
| 5,864,262 | 1/1999 | Ikada ....................................... 333/193 |

FOREIGN PATENT DOCUMENTS

| 4-16014 | 1/1992 | Japan ..................................... 333/133 |
| 5-167388 | 2/1993 | Japan . |
| 5-95253 | 4/1993 | Japan ..................................... 333/193 |
| 6-61783 | 3/1994 | Japan ..................................... 333/193 |
| 6-177697 | 6/1994 | Japan . |
| 7-66679 | 3/1995 | Japan . |
| 7-231242 | 8/1995 | Japan ..................................... 333/193 |

OTHER PUBLICATIONS

Proceedings of IEIC (The Institute of Electronics, Information, and Communication Engineers) General Conference (Mar. 24–27, 1997), Kansai University, Suita, Osaka, Japan, p. 294.

*Primary Examiner*—Robert Pascal
*Assistant Examiner*—Barbara Summons
*Attorney, Agent, or Firm*—Graham & James LLP

[57] ABSTRACT

A surface acoustic wave device has a structure in which first and second filters are connected in parallel at a connection point connected to an input terminal or an output terminal. The surface acoustic wave device includes the first SAW filter having a capacitive impedance in a passband of the second SAW filter and having a higher passband than the second SAW filter and the second SAW filter having a capacitive impedance in the passband of the first SAW filter and having a lower passband than the first SAW filter. The second SAW filter is connected in parallel at the connection point on the input terminal or output terminal side of the first SAW filter. The impedance of the first SAW filter in the passband at the parallel-connected end has, before parallel connection, a resistance component of about 1.2 $Z_0$ or higher with respect to the characteristic impedance $Z_0$ of the device, and is higher than the impedance of the second SAW filter in the passband at the parallel-connected end thereof.

20 Claims, 16 Drawing Sheets

SURFACE ACOUSTIC WAVE DEVICE WITH TWO FILTERS EACH HAVING CAPACITIVE IMPEDANCE IN THE OTHER'S PASSBAND

BACKGROUND OF THE INVENTION

1. Field of the Invention

The present invention relates to a surface acoustic wave device including a plurality of interconnected SAW filters, and more particularly, to a surface acoustic wave device which is arranged to define a filter having two or more pass bands and which is especially well suited for use in, for example, mobile communication devices or similar devices.

2. Description of the Related Art

In recent years, mobile communication devices have been required to be multi-functional. Thus, multi-band cellular phones having two or more communication systems have been developed. To provide a cellular phone having a plurality of communication systems, band-pass filters having two or more pass bands are necessary. However, it has been difficult to provide a single electronic component which provides a filter having a plurality of communication systems while also achieving low insertion loss and providing a sufficiently wide band width.

For this reason, constructing a single filter component having two or more pass bands achieved by combining a plurality of band-pass filters has been attempted.

For example, Japanese Laid-open Patent Publication No. 7-66679 discloses a diplexer made by combining a plurality of band-pass filters. FIG. 1 schematically shows the construction of the diplexer 1.

As shown in FIG. 1, a first band-pass filter 2 having a pass band in a relatively high frequency region and a second band-pass filter 3 having a pass band in a relatively low frequency region are respectively connected to input ends $IN_1$, $IN_2$. The output ends of the first and second band-pass filters 2, 3 are connected at a connection point 4. At least the second band pass filter 3 includes a SAW filter.

At least a one-port SAW resonator 5 is connected in series to the second band pass filter 3. The antiresonant frequency of the one-port SAW resonator 5 is located within the pass band of the first band-pass filter 2 or between the pass bands of the first and second band-pass filters 2 and 3. In addition, a transmission line 6 for achieving impedance matching is connected in series to the first band-pass filter 2. By using the one-port SAW resonator 5, the attenuation on the high frequency side of the second band-pass filter 3 having a pass band in a relatively lower frequency region is increased. With such an arrangement, it is possible to simplify an external circuit for impedance matching on the side of the second band pass filter 3.

Although the diplexer 1 is constructed as a single component, the overall size of the diplexer is too large since a large space is required to form a transmission line which has a sufficient electrical length. Also, in the case where the diplexer 1 is provided to have a package configuration for use in a SAW device, the width of the transmission line 6 must be made very fine. As a result, the insertion loss may deteriorate due to resistance loss caused by the large length of the transmission line 6. In addition, the area or the height of the component package is exceedingly large, which causes an increase in cost and prevents miniaturization of an electronic device including such a component.

FIG. 2 shows another example of a conventional filter device having two or more pass bands. The SAW device 11, disclosed in the Proceedings of the 1997 IEIC (Institute of Electronics, Information and Communication Engineers) General Conference, A-11-19, p294, includes a first SAW filter 12 having a pass band in a relatively high frequency region and a second SAW filter 13 having a pass band in a relatively low frequency region. The first and second SAW filters 12 and 13 are-connected at a connection point 14 on the output side. Input ends $IN_1$, $IN_2$ and an output end OUT are also provided. Thus, the first and second SAW filters 12 and 13 are connected in parallel between the output end side connection point 14 and the input ends $IN_1$, $IN_2$. One-port SAW resonators 15 and 16 are connected in series between the first and second SAW filters 12 and 13 and the connection point 14, respectively. A capacitor 17 is connected in series between the one-port SAW resonator 15 and the connection point 14.

The one-port SAW resonator 15 and the capacitor 17, which are located at the output side terminal of the first SAW filter 12, are provided to increase the impedance of the other filter, i.e. the second SAW filter 13. This prevents the insertion loss of the first and second SAW filters 12, 13 from deteriorating and increases the amount of attenuation on the high frequency side of the pass band in the first SAW filter 12.

Although the first and second SAW filters 12 and 13, the one-port SAW resonators 15 and 16 and the capacitor 17 are disposed on a single piezoelectric substrate, the capacitor 17 requires a large area on the single piezoelectric substrate in order to obtain a sufficient electrostatic capacitance for achieving the above-mentioned effect. In addition, the capacitor 17 must be constructed so that it does not influence the other SAW filter 13 on the same piezoelectric substrate, which results in a complicated arrangement of the SAW filters, resonators or the like. Consequently, although it is not necessary in the device of FIG. 2 to use a transmission line for impedance matching as is used in the device of FIG. 1, there is a limit to the ability to reduce the chip size of the surface acoustic wave device of FIG. 2.

Also, when the capacitance of the capacitor 17 is decreased to reduce insertion loss of the second SAW filter 13, the VSWR (Voltage Standing Wave Ratio) in the pass band deteriorates.

Further, in the case where the ratio of frequencies is excessively high as in the case of a combination of, for example, 800 MHz and 1.5 GHz or higher, the SAW filter having the lower frequency has a smaller impedance in the passband of the other filter having the higher frequency and also has a smaller reflection coefficient than the other SAW filter having the higher frequency, so that it is difficult to set a sufficiently high impedance. Moreover, the performance of the above-described capacitor 17 has an unsatisfactory frequency characteristic and therefore, it is difficult to obtain a suitable frequency characteristic by using the capacitor 17 if the frequency ratio is high as in the above-mentioned case.

SUMMARY OF THE INVENTION

To overcome the problems described above which were not previously recognized, the preferred embodiments of the present invention provide a surface acoustic wave device constructed and arranged to have a significantly reduced size, a significantly reduced insertion loss and a significantly reduced deterioration in a characteristic such as VSWR in a passband of a filter included in the surface acoustic wave device.

A surface acoustic wave device according to a preferred embodiment of the present invention has a structure in which first and second surface acoustic wave (SAW) filters are connected in parallel at a connection point corresponding to an input terminal or an output terminal. The surface acoustic wave device includes the first SAW filter having a capacitive impedance in a passband of the second SAW filter and having a higher passband than that of the second SAW filter, and the second SAW filter having a capacitive impedance in the passband of the first SAW filter. The passband of the second SAW filter is lower than the passband of the first SAW filter and the second SAW filter is connected in parallel at the connection point on the input terminal or output terminal side of the first SAW filter. The impedance of the first SAW filter in the passband at a parallel-connected end has, before parallel connection, a resistance component of about 1.2 $Z_0$ or higher with respect to the characteristic impedance $Z_0$ of the surface acoustic wave device, and is higher than the impedance of the second SAW filter in the passband at the parallel-connected end.

Each of the above-described first and second SAW filters may be a longitudinally coupled resonator filter having at least two interdigital transducers. The surface acoustic wave device may further comprise at least one first one-port SAW resonator connected in series between the first SAW filter and the connection point and arranged so that its antiresonant frequency is outside of the passband of the first SAW filter, and at least one second one-port SAW resonator connected in series between the second SAW filter and the connection point and arranged so that its antiresonant frequency is outside of the passband of the second SAW filter.

The first and/or second one-port SAW resonators may constitute a plurality of stages connected in series, and the wavelength of the interdigital transducer of at least one of the one-port SAW resonators in the plurality of stages is different from the wavelength of the interdigital transducer of the other one-port SAW resonator in the plurality of stages.

The first and second SAW filters and the first and second one-port SAW resonators are preferably arranged on one piezoelectric substrate for a further reduction in size.

According to preferred embodiments of the present invention, impedance matching using an external impedance element, such as an inductance element, can be achieved easily at the parallel connection point between the first and second SAW filters.

In addition, in the first SAW filter, a conductance component of the second SAW filter is added at the time of parallel connection. The conductance is not easily increased, so that suitable impedance matching can be readily achieved by connecting one inductance in parallel or series.

While the above-described arrangement using a one-port SAW resonator and a capacitor in the related art described above and shown in FIG. 2 involves the problem of the piezoelectric substrate size being increased by a capacitor structure portion, the arrangement of preferred embodiments of the present invention enables prevention of a deterioration in VSWR in a passband and facilitates impedance matching without increasing the piezoelectric substrate size.

Moreover, the arrangement in which, first and second one-port SAW resonators are connected in series between the first and second SAW filters and the parallel connection point enables the impedance of the first SAW filter located within the passband of the second SAW filter to be increased, thereby limiting a deterioration of the second SAW filter.

In the case where, the first and/or second one-port SAW resonators constitutes a plurality of stages, the frequency of at least one of the one-port SAW resonators in the plurality of stages is different from the frequency of the other one-port SAW resonators in the plurality of stages, thereby making it possible to limit ripples in the passband of the other-side SAW filter to improve the amount of attenuation over a wide frequency range.

Further, the first and second SAW filters and the first and second one-port SAW resonators are arranged on one piezoelectric substrate. This makes it easy to simultaneously form a plurality of comb-shaped electrodes. In this manner, the surface acoustic wave device of preferred embodiments of the present invention can be constructed without requiring a complicated manufacturing process and can be further reduced in size and cost.

For the purpose of illustrating the invention, there is shown in the drawings several preferred embodiments and forms which are presently preferred, it being understood, however, that the invention is not limited to the precise arrangements and instrumentalities shown.

DETAILED DESCRIPTION OF PREFERRED EMBODIMENTS

Hereinafter, preferred embodiments of the present invention are explained in detail with reference to the drawings. A surface acoustic wave device which represents a preferred embodiment of the present invention will be described below with reference to the drawings.

Figure 1:
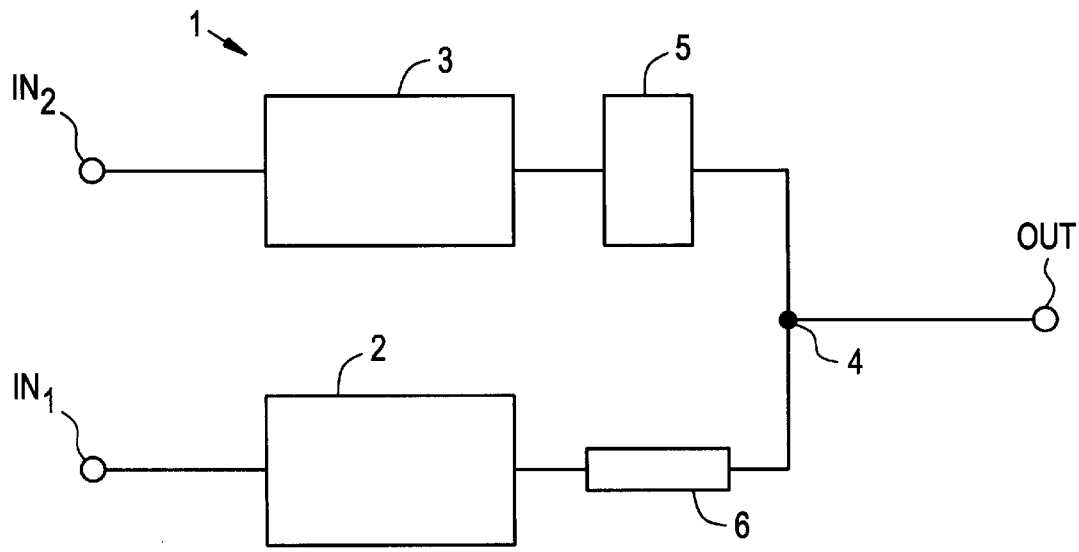
FIG. 1 is a circuit diagram for explaining a conventional surface acoustic wave device formed by connecting two band-pass filters having different passbands.
Figure 2:
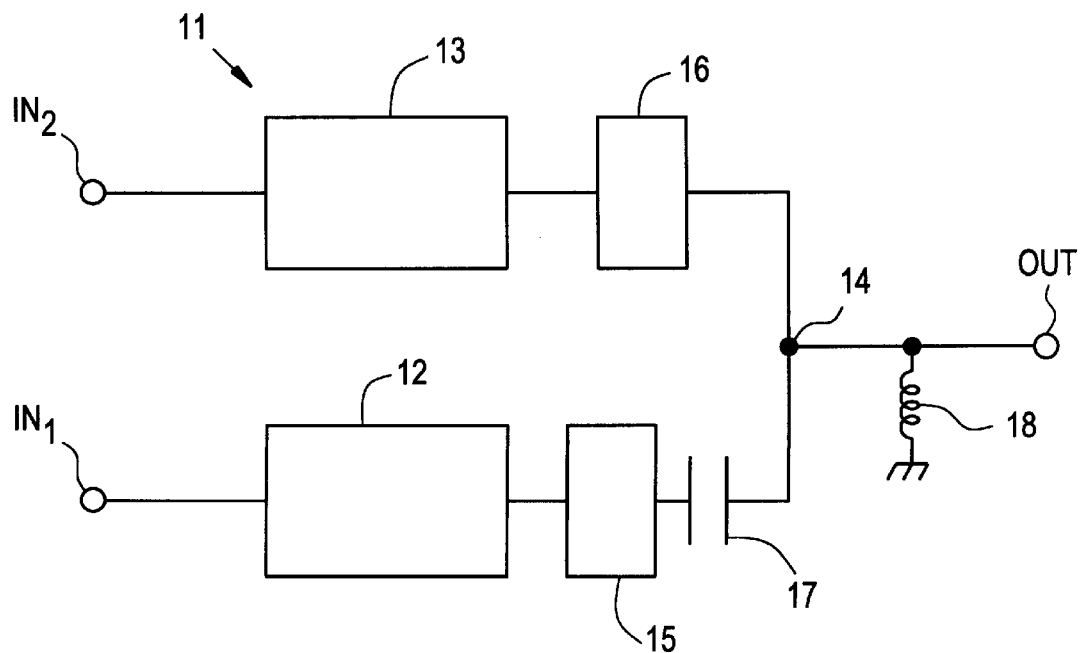
FIG. 2 is a circuit diagram of another conventional surface acoustic wave device formed by connecting two band-pass filters having different passbands.
Figure 3:
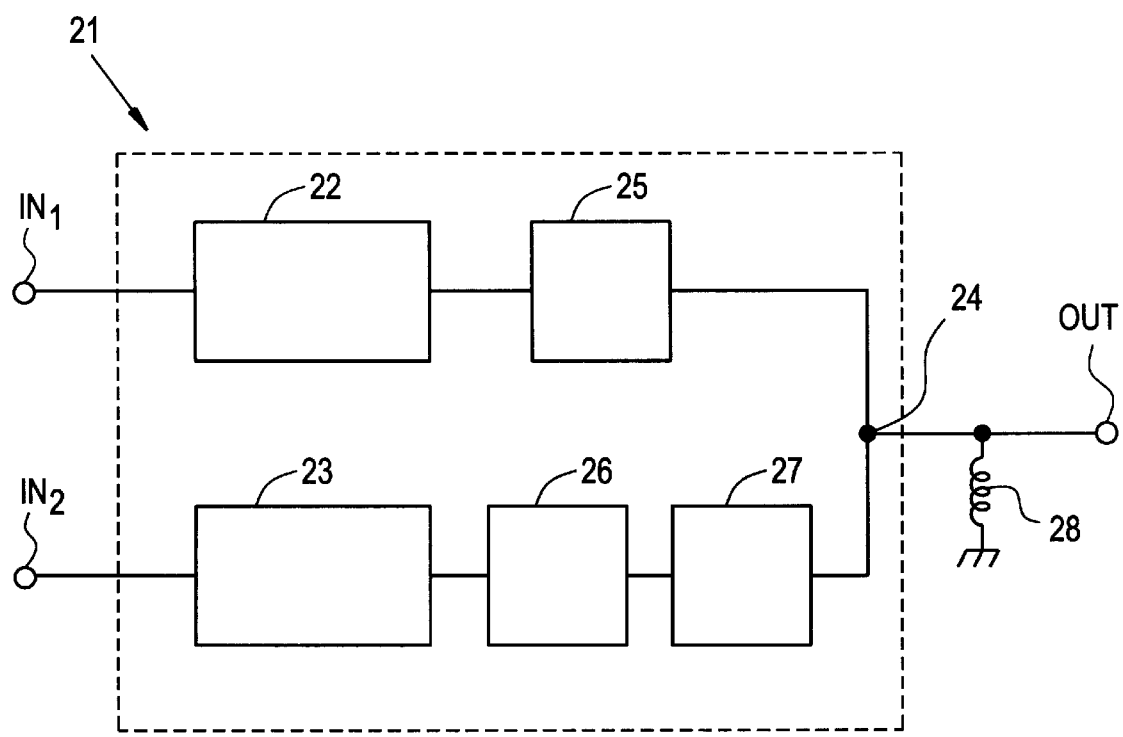
FIG. 3 is a circuit diagram of a surface acoustic wave device according to a preferred embodiment of the present invention.

FIG. 3 is a diagram showing a circuit configuration of a surface acoustic wave device according to a preferred embodiment of the present invention. A surface acoustic wave device 21 has a first SAW filter 22 and a second SAW filter 23 having different passbands. The first SAW filter 22 has a higher passband than the second SAW filter 23 and the second SAW filter 23 has a lower passband than the first SAW filter 22. Output terminals of the first and second SAW filters 22 and 23 are connected at a connection point 24. The first and second SAW filters 22 are connected in parallel on the output side of the surface acoustic wave device 21. Input terminals $IN_1$ and $IN_2$ and an output terminal OUT are also provided.

A first one-port SAW resonator 25 is connected between the first SAW filter 22 and the connection point 24. A pair of second one-port SAW resonators 26 and 27 are connected in series between the second SAW filter 23 and the connection point 24.

Figure 4:
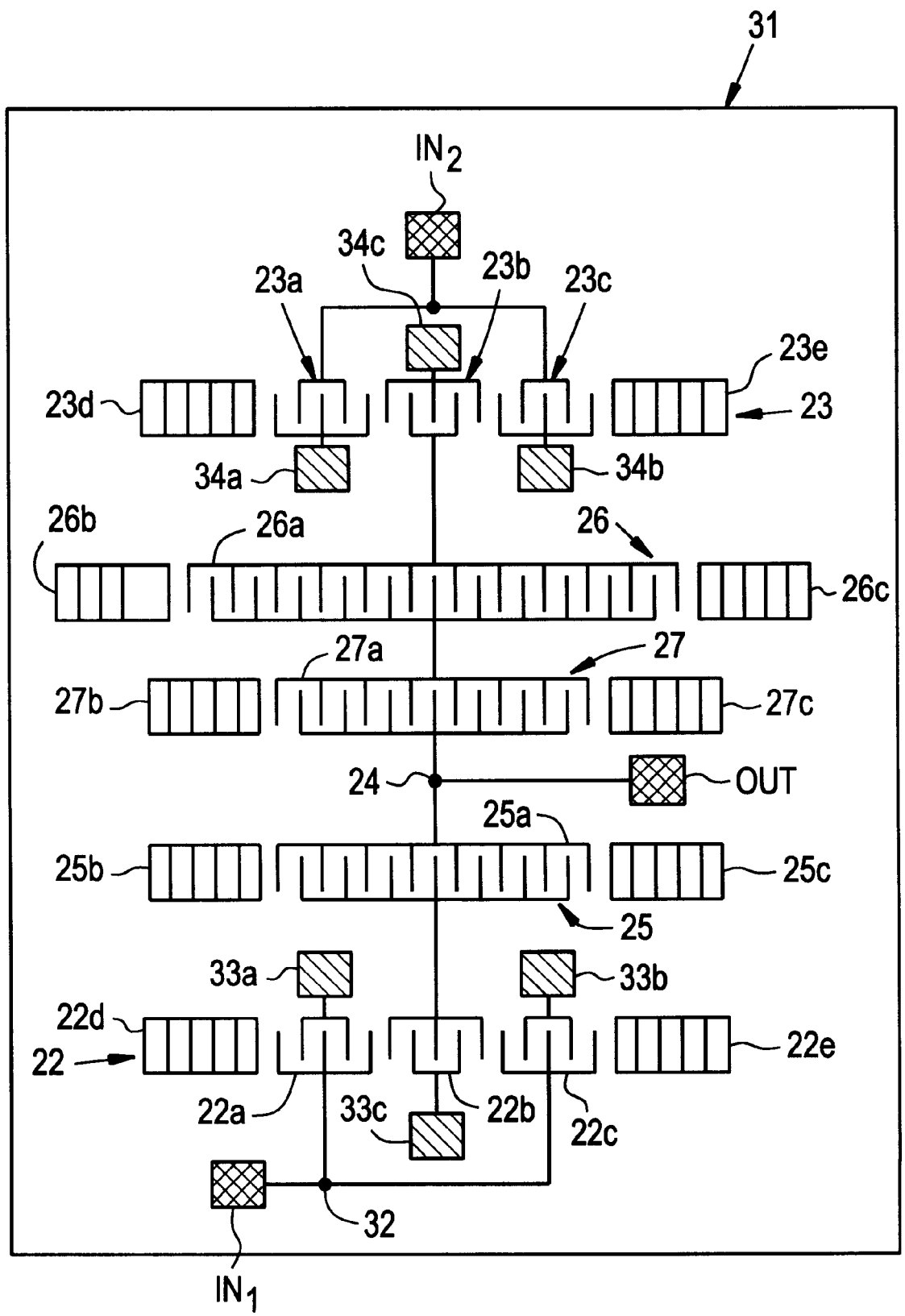
FIG. 4 is a schematic plan view for explaining an example of the structure of the surface acoustic wave device shown in FIG. 3.
Figure 5:
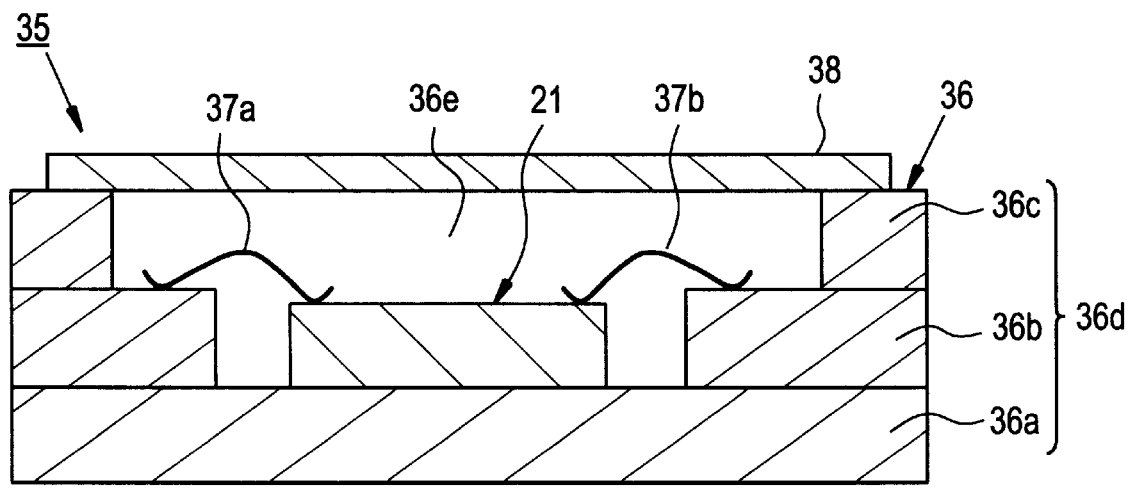
FIG. 5 is a cross-sectional view for explaining a structure in which the surface acoustic wave device shown in FIG. 4 is disposed in a package.

FIG. 4 is a schematic plan view of an actual arrangement of the surface acoustic wave device 21 according to preferred embodiments of the present invention, and FIG. 5 is a cross-sectional view of the structure of a package in which the surface acoustic wave device is disposed.

As is apparent from FIG. 4, the surface acoustic wave device 21 includes a substantially rectangular piezoelectric substrate 31. The piezoelectric substrate 31 may be formed of a piezoelectric ceramic such as lead titanate zirconate piezoelectric ceramic or a piezoelectric single crystal of quartz, $LiTaO_3$ or $LiNbO_3$ or other suitable material. In an example of preferred embodiments of the present invention, a 41° Y-X cut $LiNbO_3$ substrate is used.

On the piezoelectric substrate 31, input terminals $IN_1$ and $IN_2$ are formed of an electroconductive film. The first SAW filter 22 is connected to the input terminal $IN_1$. The first SAW filter 22 is preferably a longitudinally coupled SAW filter having three IDTs 22a to 22c. Comb-shaped finger electrodes on one side of the outer IDTs 22a and 22c are connected to each other at a connection point 32 which is connected to the input terminal $IN_1$. The other comb-shaped finger electrodes of the IDTs 22a and 22c are connected to ground electrodes 33a and 33b, which are connected to a ground potential by bonding wires (not shown) or suitable connection members.

One comb-shaped electrode of the central IDT 22b is also connected electrically to a ground electrode 33c. The other comb-shaped electrode of the IDT 22b is connected to the first one-port SAW resonator 25.

Reflectors 22d and 22e are disposed on the opposite sides in the surface wave propagation direction of the area on the substrate 31 where the IDTs 22a to 22c are located.

The second SAW filter 23 preferably is connected to the input terminal $IN_2$. The second SAW filter 23 is a longitudinally coupled SAW filter having three IDTs 23a to 23c. Comb-shaped electrodes on one side of the outer IDTs 23a and 23c are connected to the input terminal $IN_2$. The other comb-shaped electrodes of the IDTs 23a and 23c are connected to ground electrodes 34a and 34b. One comb-shaped electrode of the central IDT 23b is also connected to a ground terminal electrode 34c. The other comb-shaped electrode of the IDT 23b is connected to the second one-port SAW resonator 26.

Reflectors 23d and 23e are disposed on the opposite sides in the surface wave propagation direction of the area on the substrate 31 where the IDTs 23a to 23c are provided.

One terminal of the second one-port SAW resonator 26 is connected to the second SAW filter 23 as described above while the other terminal of the second one-port SAW resonator 26 is connected to the second one-port SAW resonator 27. The other terminal of the second one-port SAW resonator 27 is connected to the connection point 24. Similarly, the other terminal of the first one-port SAW resonator 25 is also connected to the connection point 24. That is, the first and second SAW filters 22 and 23 are connected in parallel by being connected to the connection point 24 on the output side. The connection point 24 is electrically connected to the output terminal OUT.

Each of the one-port SAW resonators 25, 26, and 27 has a structure in which reflectors 25b and 25c, 26b and 26c, or 27b and 27c are located on opposite sides in the surface wave propagation direction of the IDTs 25a, 26a or 27a.

It is not always necessary to provide reflectors 25b and 25c in the one-port SAW resonator 25. Also, it is not always necessary to provide reflectors 26b and 26c in the one-port SAW resonator 26. Further, it is not always necessary to provide reflectors 27b and 27c. If reflectors 27b and 27c are provided, it is desirable that the number of electrode fingers be smaller than those of the other reflectors.

Further, it is not always necessary to provide the reflectors 22d, 22e, 23d and 23e on the opposite sides in the first and second SAW filters 22 and 23.

Each of the first and second SAW filters 22 and 23, the first and second one-port SAW resonators 25 to 27, the input terminals $IN_1$ and $IN_2$ and the output terminal OUT, is preferably formed by applying and patterning an electroconductive material such as Al on the piezoelectric substrate 31.

The size of the surface acoustic wave device 21 having a plurality of passbands can be easily reduced by forming the elements described above on one piezoelectric substrate 31 in the above-described manner. Since the above-described electrodes can be simultaneously formed by patterning of Al or the like on the piezoelectric substrate 31, the manufacturing process is not complicated.

The above-described surface acoustic wave device 21 can be incorporated in a package in the same manner as an ordinary surface acoustic wave filter. That is, a surface acoustic wave apparatus 35 shown in FIG. 5 has a surface acoustic wave device 21 accommodated in a package 36 preferably formed of an insulating ceramic. The package 36 has a package body 36d constructed by superposing substantially rectangular frame members 36b and 36c on a ceramic substrate 36a formed of an insulating ceramic.

The surface acoustic wave device 21 is placed in an opening 36e of the package body 36d and is fixed on the ceramic substrate 36a.

The input terminals, the output terminal and the ground terminals of the surface acoustic wave device are suitably connected electrically via bonding wires 37a and 37b to electrodes (not shown) provided on the package body 36d. The opening 36e is closed by a lid member 38 which is preferably made of a metal.

As is apparent from FIG. 5, the surface acoustic wave apparatus 35 can be provided as a package-type main component so that the outer appearance of the apparatus 35 is similar to an ordinary surface acoustic wave device by using a package 36 that is used for packaging conventional surface acoustic wave devices.

Next, the effect of obtaining the desired, significantly improved filter characteristics in the surface acoustic wave device 21 of the present invention will be described with respect to preferred embodiments of the present invention.

Figure 6:
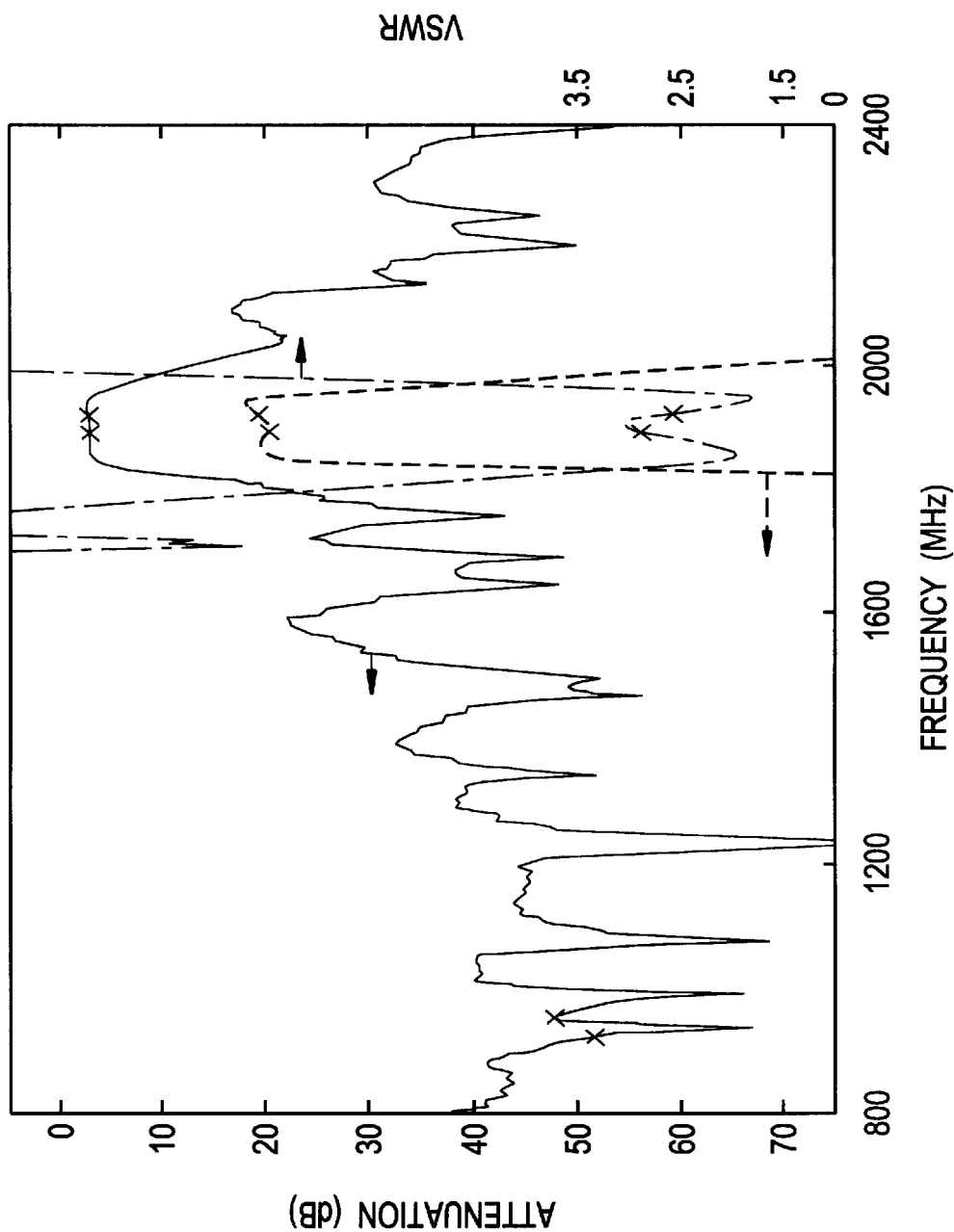
FIG. 6 is a graph showing a frequency-attenuation characteristic and a frequency-VSWR characteristic of the first SAW filter in the surface acoustic wave device shown in FIG. 3.
Figure 7A:
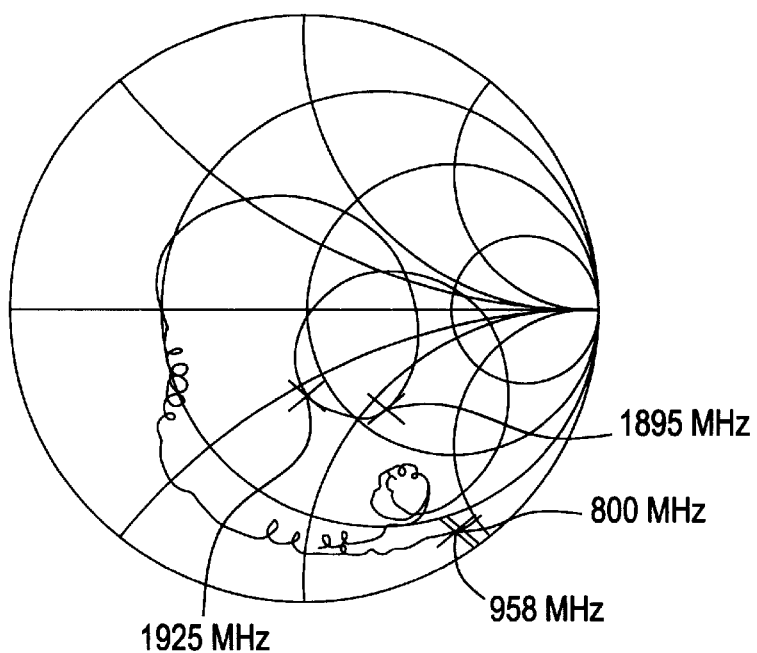
FIGS. 7A and 7B are Smith charts of the impedances of the first SAW filter on the input side and on the output side, respectively.
Figure 7B:
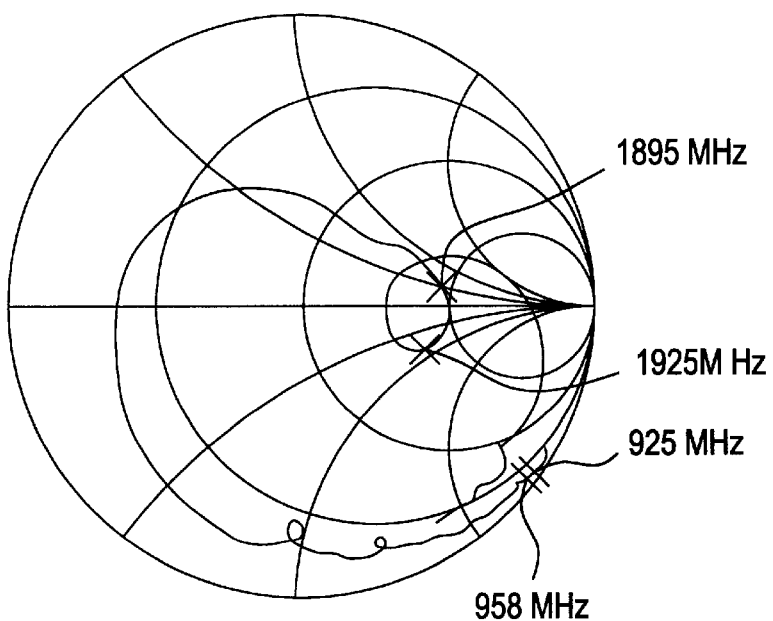

In examples of preferred embodiments of the present invention, the passband of the first SAW filter 22 is preferably about 1895 MHz to about 1925 MHz. FIG. 6 shows a frequency-attenuation characteristic and a frequency-VSWR characteristic of the first SAW filter 22 in and out of the passband. In FIG. 6 and in FIGS. 10, 12, 14, and 16, an essential portion of a frequency-attenuation curve indicated by a solid line is shown in an enlarged state by a broken line. FIGS. 7A and 7B respectively show Smith charts of the impedances of the first SAW filter 22 on the input side and on the output side.

Referring to FIG. 7B, on the output side of the first SAW filter 22 corresponding to the parallel connection side, the resistance component of the passband impedance is sufficiently higher than about 60 Ω. Accordingly, the VSWR of the single unit of the first SAW filter 22 is large, having a value of 3 or more and the loss due to mismatching is large.

Figure 8A:
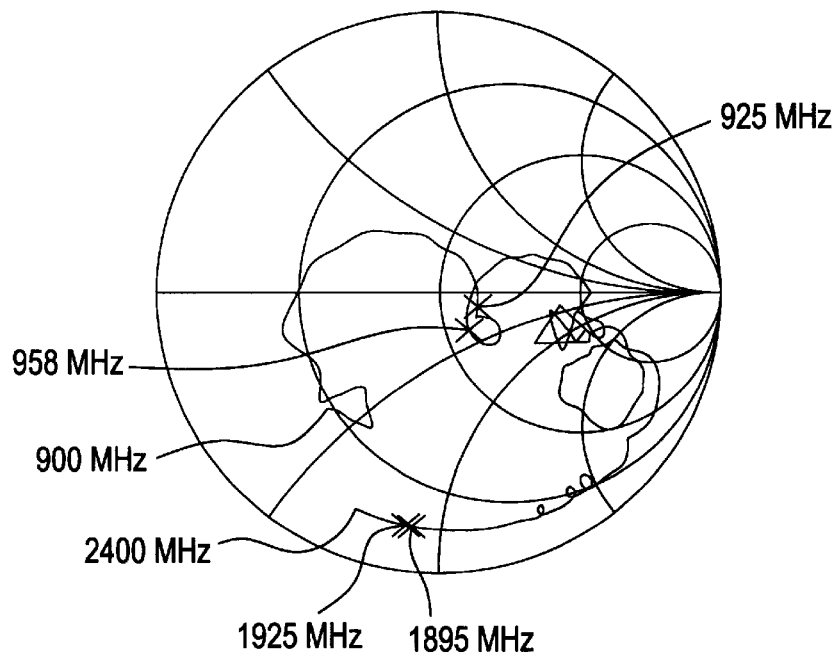
FIGS. 8A and 8B are Smith charts of the impedances of the second SAW filter on the input side and on the output side, respectively.
Figure 8B:
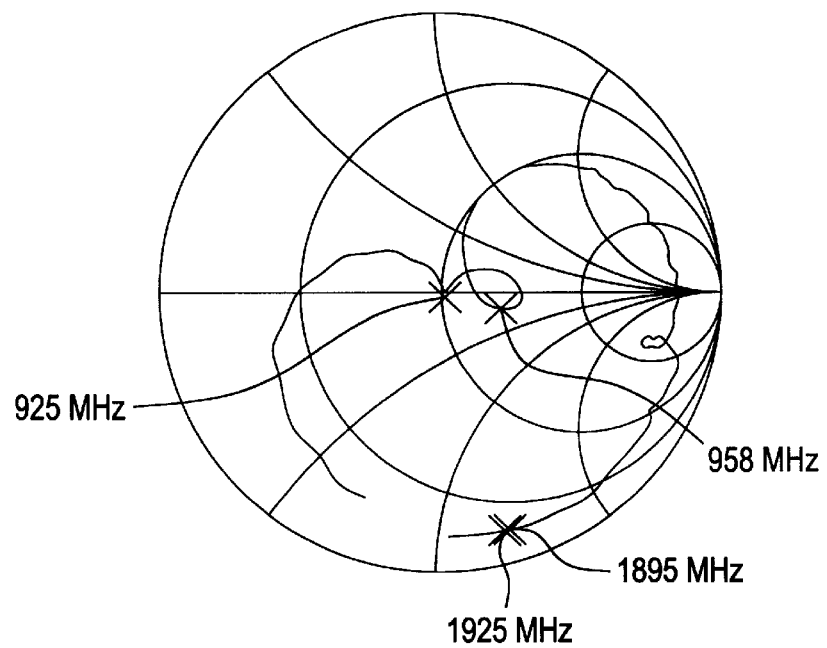

On the other hand, the passband of the second SAW filter 23 is preferably set to about 925 MHz to about 958 MHz. FIGS. 8A and 8B respectively show Smith charts of the input-side and output-side impedances of the single unit of the second SAW filter 23 in and out of the passband.

It is apparent from FIG. 8B that the resistance component of the impedance of the passband on the parallel connection side, i.e. the output side, is about 50 Ω when the characteristic impedance $Z_0$ of the surface acoustic wave device is $Z_0 = 50$ Ω.

The impedance of the second SAW filter 23 in the passband of the first SAW filter 22 (about 1895 MHz to about 1925 MHz) is lower than the impedance of the first SAW filter in the passband of the second SAW filter (about 925 MHz to about 958 MHz), and the reflection coefficient is about 0.85.

Figure 9A:
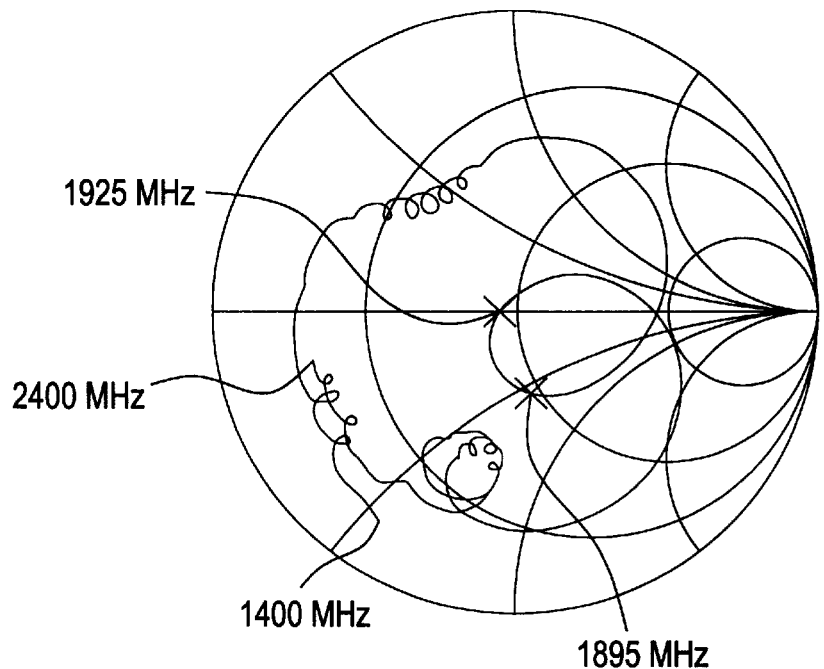
FIG. 9A and 9B are Smith charts of the impedances on the input side and on the output side, respectively in the arrangement in which a first one-port SAW resonator is connected in series with the first SAW filter.
Figure 9B:
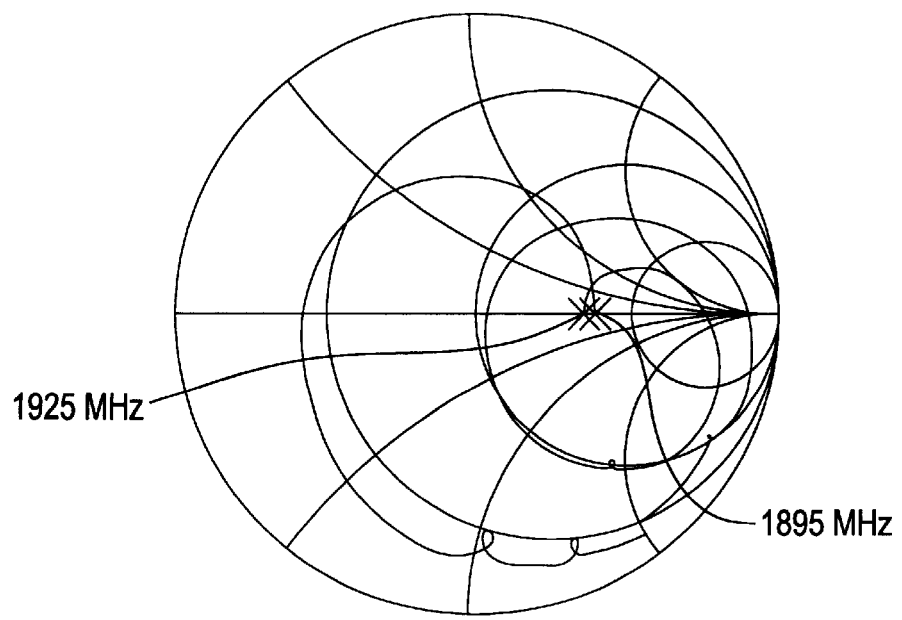

On the other hand, referring back to FIG. 3, the first one-port SAW resonator 25 is connected in series with the first SAW filter 22 such that the antiresonant frequency of the first one-port SAW resonator 25 is outside of the passband of the first SAW filter 22 and is set to be located on the high-frequency side of the passband. FIGS. 9A and 9B respectively show Smith charts of the input-side and output-side impedances in and out of the passband when the first one-port SAW resonator 25 is connected in series on the output side of the first SAW filter 22.

It is apparent from comparison between FIGS. 9B and 7B that the impedance shown in FIG. 9B is increased significantly through the entire range by the effect of the series connection of the one-port SAW resonator 25 to the first SAW filter 22.

On the other hand, referring to FIG. 3, the second one-port SAW resonators 26 and 27 inserted in series between the second SAW filter 23 and the connection point 24 are connected in series such that their antiresonant frequencies are outside of the passband of the second SAW filter 23.

Figure 10:
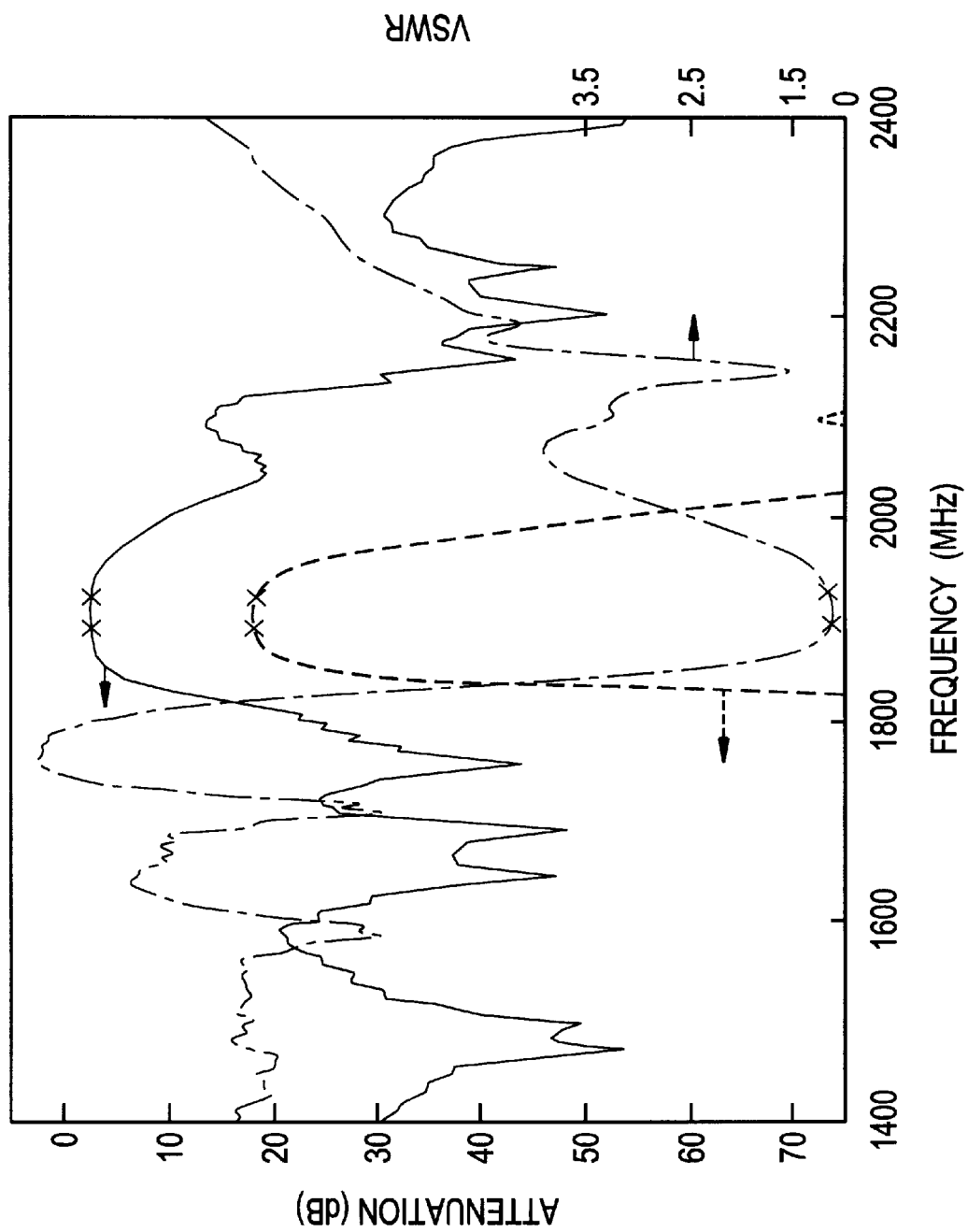
FIG. 10 is a graph showing a frequency-attenuation =characteristic and a frequency-VSWR characteristic on the first SAW filter 22 side in the surface acoustic wave device shown in FIG. 3.
Figure 11A:
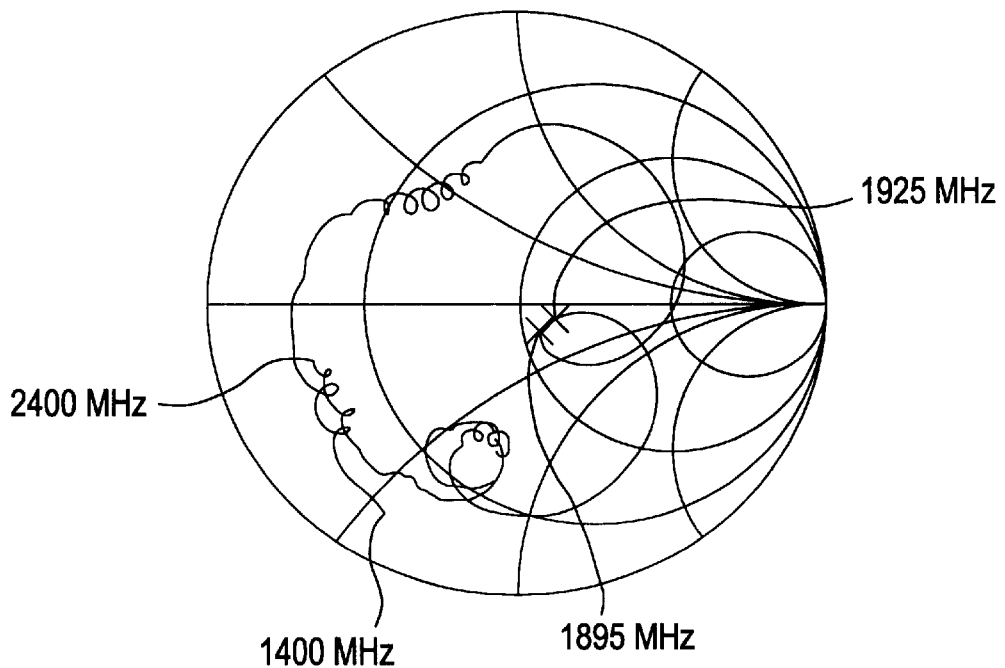
FIGS. 11A and 11B are Smith charts of the impedances on the input side and on the output side on the first SAW filter side in the surface acoustic wave device shown in FIG. 3, respectively.
Figure 11B:
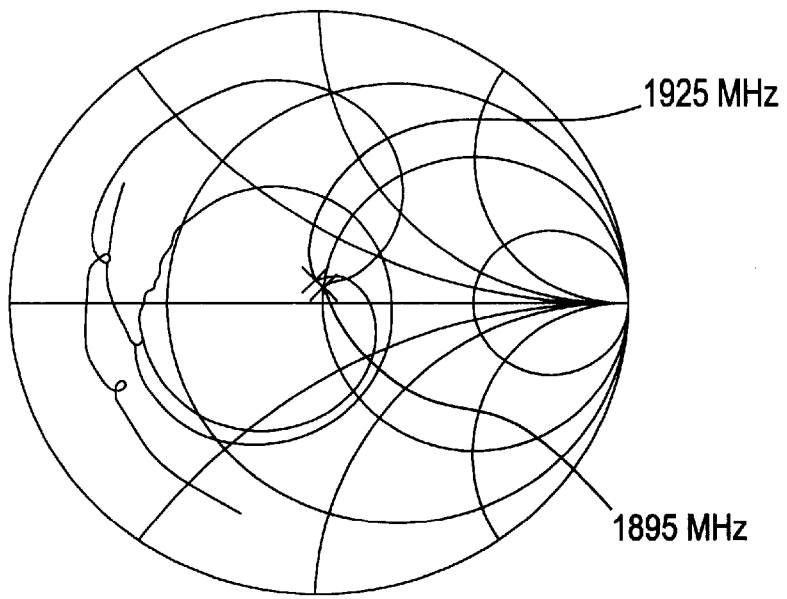

FIG. 10 shows a frequency-attenuation characteristic and a frequency-VSWR characteristic in and out of the pass band on the first SAW filter 22 side in the surface acoustic wave device 21 of this preferred embodiment, i.e., when the circuit elements are connected as shown in the circuit diagram of FIG. 3, and FIGS. 11A and 11B respectively show Smith charts of the input-side and output-side impedances. An impedance matching inductance element 28 of 12 nH is connected between the parallel connection point 24 and the ground potential. The second SAW filter 23 is terminated by about 50 Ω at the input side.

It can be understood that, by the effect of parallel connection of the second SAW filter 23 and connection of the above-mentioned inductance, the VSWR in the passband of the first SAW filter 22 at the connection point 24 is about 1.2 or less as shown in FIG. 10, and that the loss due to mismatching is small.

Figure 12:
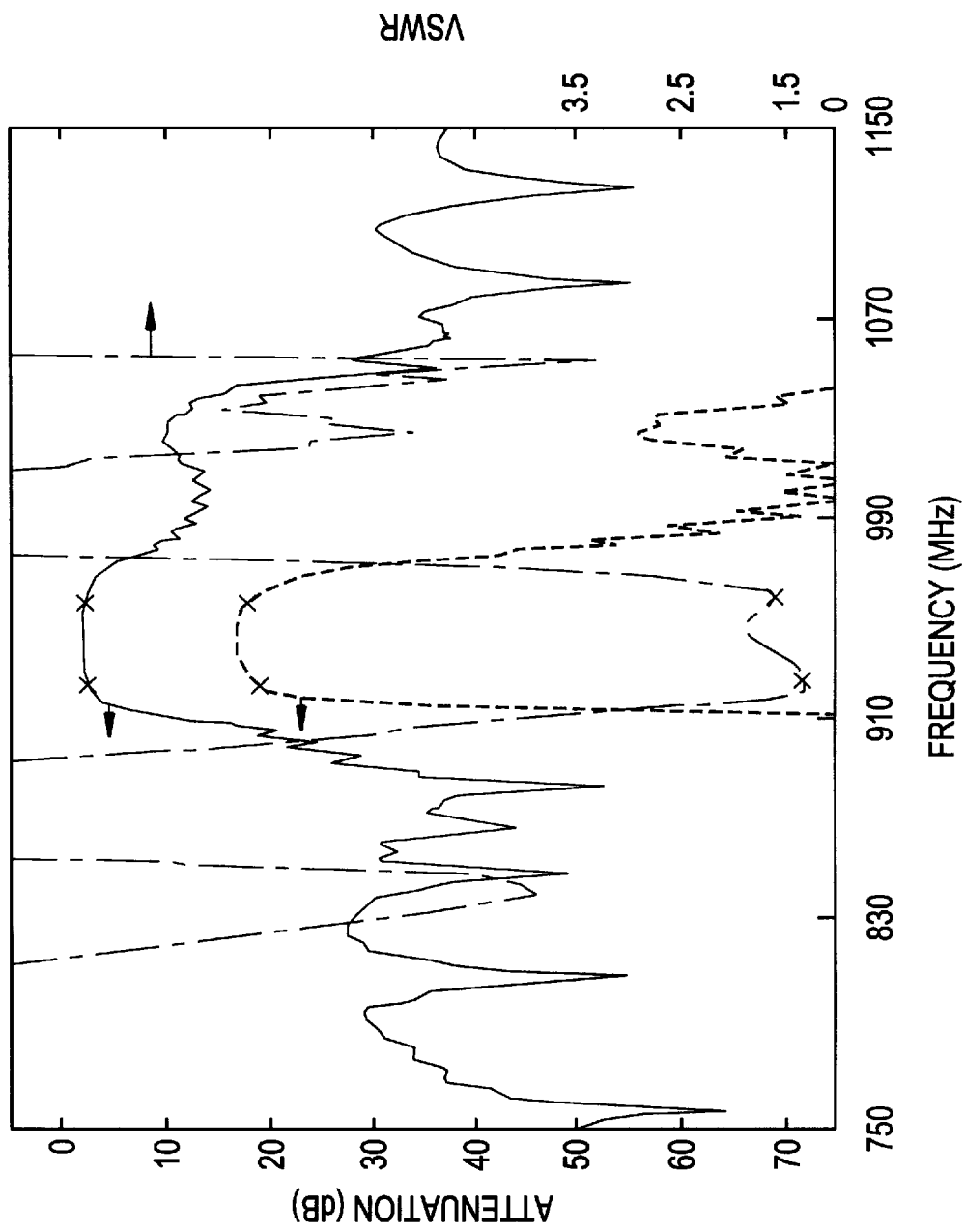
FIG. 12 is a graph showing a frequency-amplitude characteristic and a frequency-VSWR characteristic on the second SAW filter side in the surface acoustic wave device of the surface acoustic wave device shown in FIG. 3.
Figure 13A:
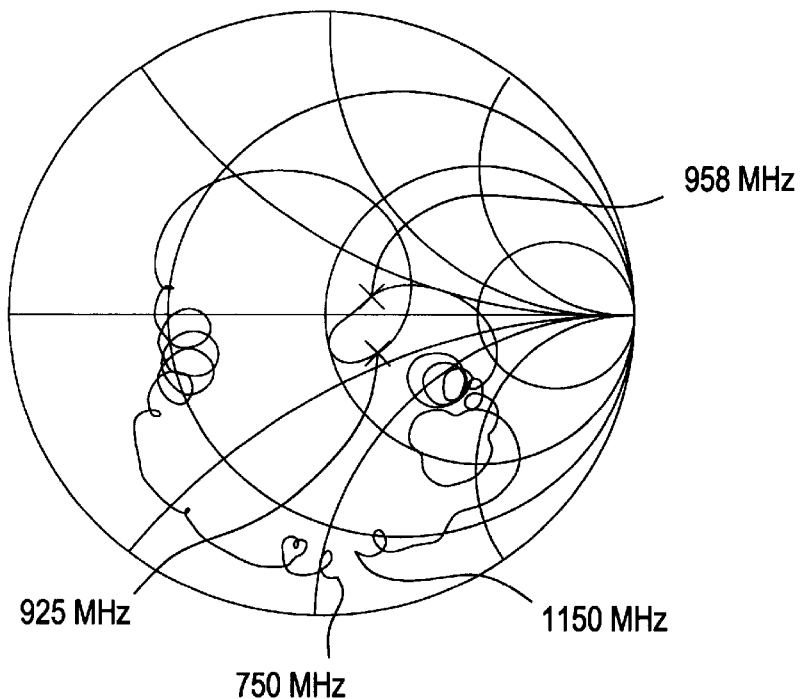
FIGS. 13A and 13B are Smith charts of the impedances on the input side and on the output side on the second SAW filter side in the surface acoustic wave device shown in FIG. 3, respectively.
Figure 13B:
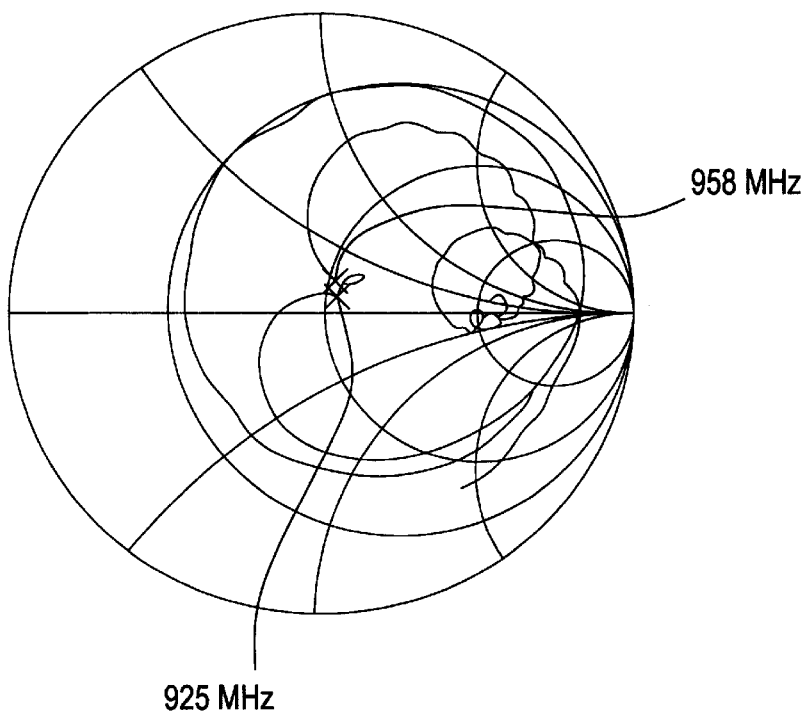

FIG. 12 shows a frequency-attenuation characteristic and a frequency-VSWR characteristic in and out of the pass band on the second SAW filter 23 side in the surface acoustic wave device 21 of this preferred embodiment, i.e., when the circuit elements are connected in accordance with the circuit diagram of FIG. 3, and FIGS. 13A and 13B respectively show Smith charts of the input-side and output-side impedances. An impedance matching inductance element 28 of 12 nH, used in common for the first SAW filter 22, is connected between the parallel connection point 24 and the ground potential. The first SAW filter 22 is terminated by about 50 Ω at the input side.

As can be understood from FIG. 12, the VSWR in the passband of the second SAW filter 23 at the connection point 24 is small, having a value of about 2 or less.

Figure 14:
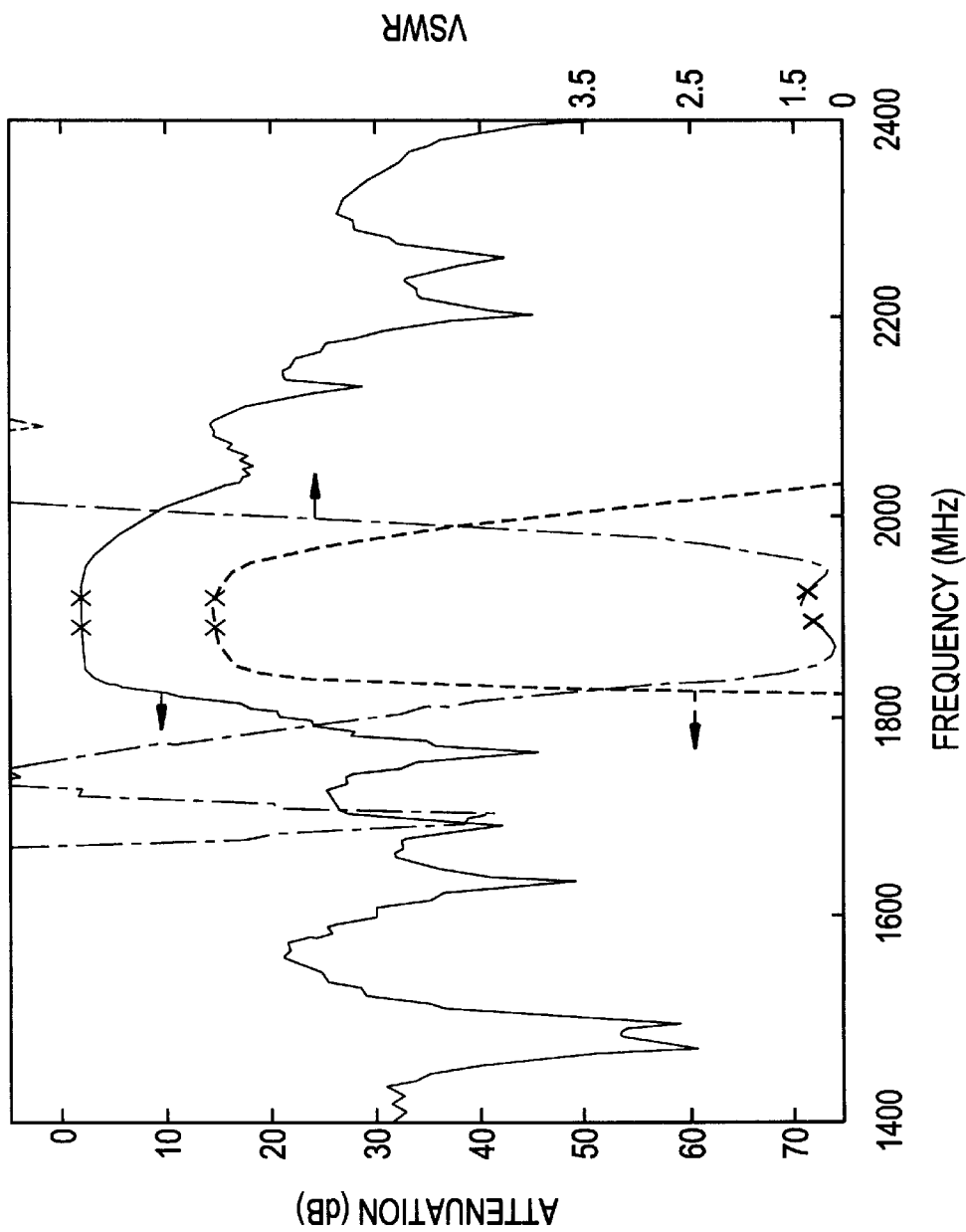
FIG. 14 is a graph showing a frequency-amplitude characteristic and a frequency-VSWR characteristic of the first SAW filter in and out of the passband when the passband impedance before parallel connection is close to about 50 Ω.
Figure 15A:
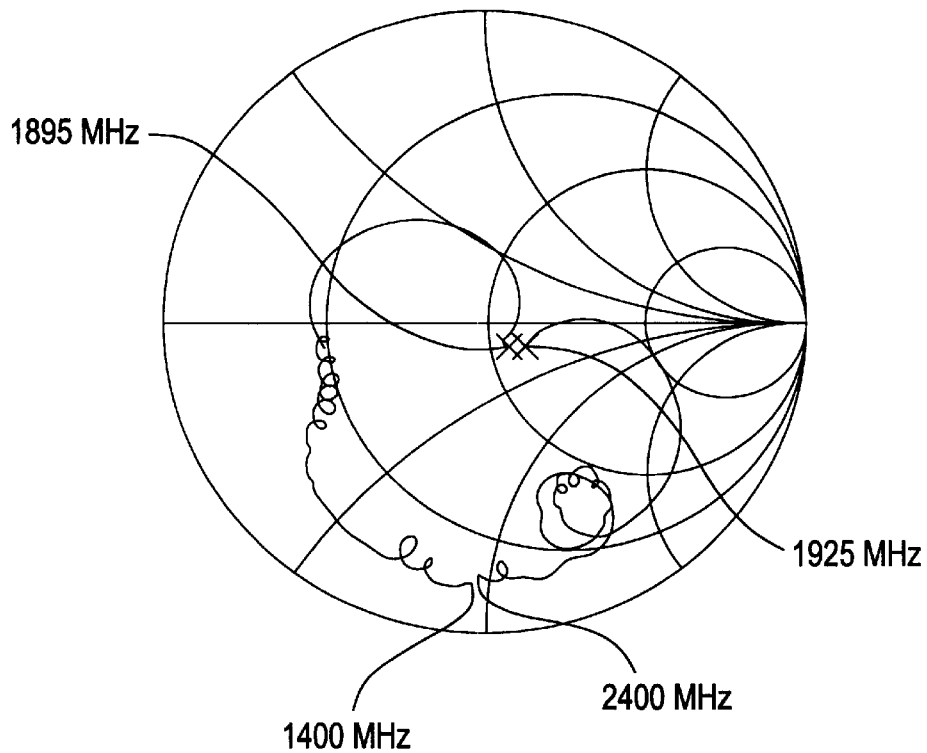
FIGS. 15A and 15B are Smith charts of the impedances on the input side and on the output side on the first SAW filter side relating to the characteristics shown in FIG. 14, respectively.
Figure 15B:
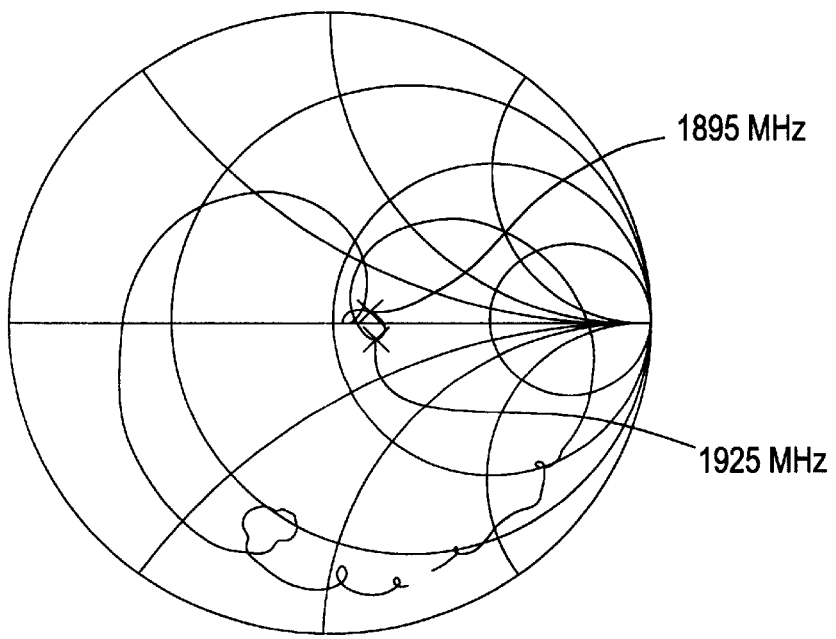

On the other hand, FIG. 14 shows a frequency-attenuation characteristic and a frequency-VSWR characteristic of the first SAW filter 22 in and out of the pass band before parallel connection and when the impedance in the passband is close to about 50 Ω, and FIGS. 15A and 15B show Smith charts of the input-side and output-side impedances.

Figure 16:
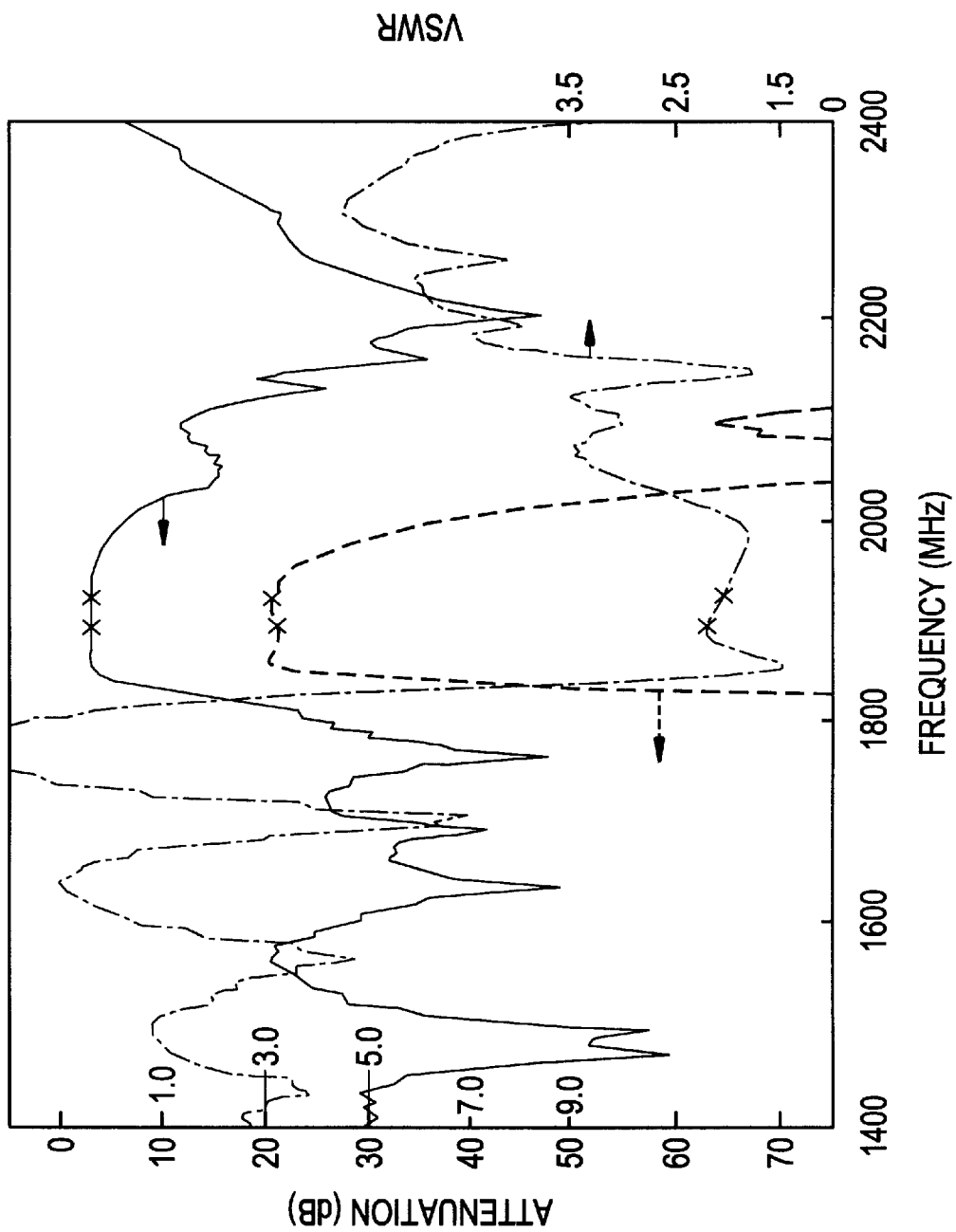
FIG. 16 is a graph showing a frequency-amplitude characteristic and a frequency-VSWR characteristic in the case where the first SAW filter having the characteristics shown in FIG. 14 is used in the surface acoustic wave device shown in FIG. 3.

It is apparent from FIG. 15B that the second SAW filter 23 passband impedance is lower than the passband impedance shown in FIG. 8B. It can also be recognized that, with respect to the single unit of the first SAW filter 22, the VSWR is about 1.4 or less and the passband loss is small. FIG. 16 shows a frequency-attenuation characteristic and a frequency-VSWR characteristic in and out of the pass band in the case where the first SAW filter 22 is used and the circuit elements are connected as shown in the circuit diagram of FIG. 3, and FIGS. 11A and 11B show Smith charts of the impedances on the input side and on the output side. Impedance matching inductance element 28 of 12 nH is provided between the parallel connection point 24 and the ground potential. The second SAW filter 23 is terminated by about 50 Ω at the input side.

It is apparent that, in the frequency-attenuation characteristic shown in FIG. 16, in comparison with the frequency-attenuation characteristic shown in FIG. 10, the VSWR in the passband is larger than about 2 and the loss is also larger.

Figure 17A:
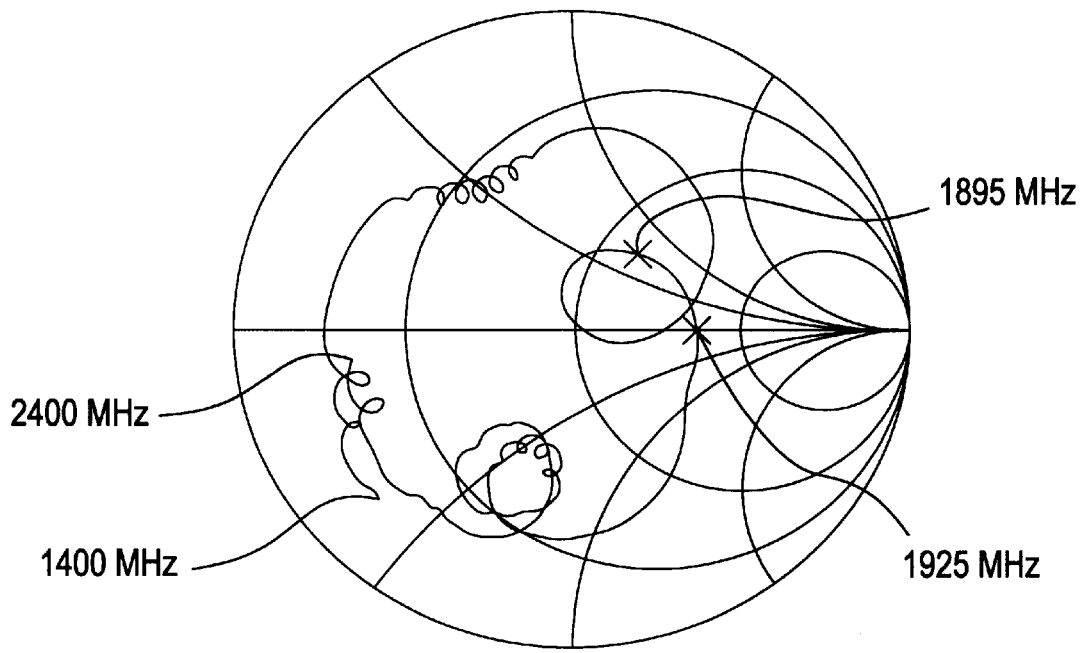
FIGS. 17A and 17B are Smith charts of the impedances on the input side and on the output side on relating to the characteristics shown in FIG. 16, respectively.
Figure 17B:
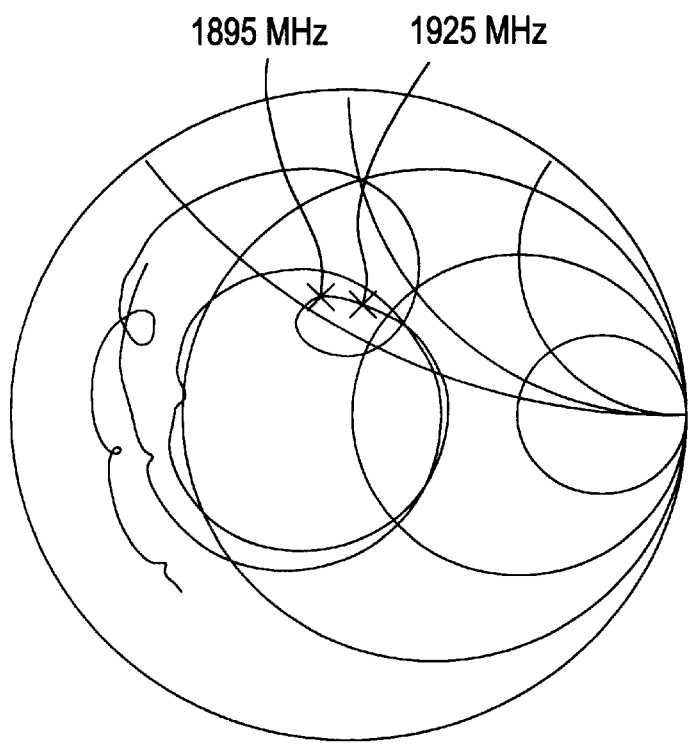

FIGS. 17A and 17B respectively show Smith charts of the input-side and output-side impedances in the case shown in FIG. 16. It is apparent from FIGS. 17A and 17B that, on the common connection terminal side, the resistance component is smaller than about 50 Ω and a shift on the inductivity side is exhibited. To correct this shift on the inductivity side, the value of the matching inductance may be increased. Adversely, the VSWR of the second SAW filter 23 is thereby increased, resulting in an increase in insertion loss.

Consequently, it can be clearly understood from the above-described preferred embodiments that, in the surface acoustic wave device having the first and second SAW filters 22 and 23 connected at the parallel connection point 24, when the first SAW filter 22 having the higher impedance in the passband of the other-side filter and the second SAW filter 23 having the lower impedance in the passband of the other-side filter are connected in parallel at the output side, the impedances at the connection point 24 in the two passbands of the two SAW filters 22 and 23 can be brought closer to each other by setting the impedance of the first SAW filter 22 in the passband higher than the impedance of the second SAW filter 23 in the passband, thereby facilitating impedance matching using an external matching element.

Further, in the first SAW filter 22, the resistance component in the passband is preferably set higher than about 60 Ω, that is, if the impedance of the device is $Z_0$, the resistance component in the passband is preferably set higher than about 1.2 $Z_0$. Therefore, even if a conductance component of the SAW filter 23 is added at the time of parallel connection of the first and second SAW filters 22 and 23, the conductance does not exceed about 0.02 mS. As a result, impedance matching can be effected only by connecting one inductance in parallel or series.

The first and second SAW filters 22 and 23 may be connected in parallel at the input side instead of being connected at the output side.

Further, because in this preferred embodiment, the above-described first one-port SAW resonator 25 is connected in series between the first SAW filter 22 and the connection point 24, the impedance of the first SAW filter 22 in the passband of the second SAW filter 23 can be increased, thereby limiting a deterioration of the second SAW filter 23.

Similarly, the second one-port SAW resonators 26 and 27 are connected between the second SAW filter 23 and the parallel connection point 24, a deterioration of the first SAW filter 22 can be limited. Moreover, since the resonant frequencies of the second one-port SAW resonators 26 and 27 are different from each other, it is possible to effectively reduce ripples in the passband of the first SAW filter 22, thereby improving the amount of attenuation over a wide range.

It is noted that it is not always necessary to provide the first and second one-port SAW resonators 25, 26, and 27. Also, a plurality of resonator stages may be arranged in place of the first one-port SAW resonator 25, as with the arrangement of the one-port SAW resonators 26 and 27. In such a case, the frequencies of the one-port SAW resonators may be different from each other to reduce ripples in the passband of the second SAW filter 23.

A single one-port SAW resonator may be used in place of the two one-port SAW resonators 26 and 27.

Further, each of the first and second SAW filters 22 and 23 may be formed of a SAW filter other than the longitudinal coupling type SAW resonator filter and is not limited to a particular type.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A surface acoustic wave device comprising:
   a first surface acoustic wave (SAW) filter and a second SAW filter connected to each other in parallel at a connection point located near one of an input terminal and an output terminal of the surface acoustic wave device, the first SAW filter having a capacitive impedance in a passband of the second SAW filter and having a higher passband than that of the second SAW filter and the second SAW filter having a capacitive impedance in the passband of the first SAW filter; wherein
   the impedance of the first SAW filter in the passband at an end thereof which is connected to the second SAW filter has, before parallel connection, a resistance component of about 1.2 $Z_0$ or higher with respect to a characteristic impedance $Z_0$ of the surface acoustic wave device, and the impedance of the first SAW filter is higher than the impedance of the second SAW filter in the passband at the end thereof which is connected to the second SAW filter.

2. A surface acoustic wave device according to claim 1, wherein each of the first and second SAW filters is a longitudinally coupled resonator filter having at least two interdigital transducers, the surface acoustic wave device further comprising:
   at least one first one-port SAW resonator connected in series between the first SAW filter and the connection point and arranged so that an antiresonant frequency of the at least one first one-port SAW resonator is outside of the passband of the first SAW filter; and
   at least one second one-port SAW resonator connected in series between the second SAW filter and the connection point and arranged so that an antiresonant frequency of the at least one second one-port SAW resonator is outside of the passband of the second SAW filter.

3. A surface acoustic wave device according to claim 2, wherein at least one of the first and second one-port SAW resonators constitutes a plurality of stages connected in series, and a wavelength of an interdigital transducer of at least one of the one-port SAW resonators in the plurality of stages being different from a wavelength of an interdigital transducer of the other one-port SAW resonator in the plurality of stages.

4. A surface acoustic wave device according to claim 2, further comprising a single piezoelectric substrate, wherein the first and second SAW filters and the first and second one-port SAW resonators are arranged on the single piezoelectric substrate.

5. A surface acoustic wave device according to claim 1, further comprising an impedance matching inductance element connected to the connection point.

6. A surface acoustic wave device comprising:
   a first surface acoustic wave (SAW) filter and a second SAW filter connected to each other in parallel at a connection point which is connected to one of an input terminal and an output terminal of the surface acoustic wave device, the first SAW filter having a capacitive impedance in a passband of the second SAW filter and having a higher passband than that of the second SAW filter and the second SAW filter having a capacitive impedance in the passband of the first SAW filter;

at least one first one-port SAW resonator connected in series between the first SAW filter and the connection point and arranged so that an antiresonant frequency of the at least one first one-port SAW resonator is outside of the passband of the first SAW filter; and at least one second one-port SAW resonator connected in series between the second SAW filter and the connection point and arranged so that an antiresonant frequency of the at least one second one-port SAW resonator is outside of the passband of the second SAW filter.

7. A surface acoustic wave device according to claim 6, wherein the impedance of the first SAW filter in the passband at an end thereof which is connected to the second SAW filter has, before parallel connection, a resistance component of about 1.2 $Z_0$ or higher with respect to a characteristic impedance $Z_0$ of the surface acoustic wave device, and the impedance of the first SAW filter is higher than the impedance of the second SAW filter in the passband at the end thereof which is connected to the second SAW filter.

8. A surface acoustic wave device according to claim 6, wherein each of the first and second SAW filters is a longitudinally coupled resonator filter having at least two interdigital transducers.

9. A surface acoustic wave device according to claim 6, wherein at least one of the first and second one-port SAW resonators constitutes a plurality of stages connected in series, and a wavelength of the interdigital transducer of at least one of the one-port SAW resonators in the plurality of stages being different from a wavelength of the interdigital transducer of the other one-port SAW resonator in the plurality of stages.

10. A surface acoustic wave device according to claim 6, further comprising a single piezoelectric substrate, wherein the first and second SAW filters and the first and second one-port SAW resonators are arranged on the single piezoelectric substrate.

11. An electronic component comprising:

a case;

a surface acoustic wave element provided in the case and including:

a first surface acoustic wave (SAW) filter and a second SAW filter connected to each other in parallel at a connection point located near one of an input terminal and an output terminal of the surface acoustic wave device, the first SAW filter having a capacitive impedance in a passband of the second SAW filter and having a higher passband than that of the second SAW filter and the second SAW filter having a capacitive impedance in the passband of the first SAW filter; wherein the impedance of the first SAW filter in the passband at an end thereof which is connected to the second SAW filter has, before parallel connection, a resistance component of about 1.2 $Z_0$ or higher with respect to a characteristic impedance $Z_0$ of the surface acoustic wave device, and the impedance of the first SAW filter is higher than the impedance of the second SAW filter in the passband at the end thereof which is connected to the second SAW filter.

12. An electronic component according to claim 11, wherein each of the first and second SAW filters is a longitudinally coupled resonator filter having at least two interdigital transducers, the surface acoustic wave device further comprising:

at least one first one-port SAW resonator connected in series between the first SAW filter and the connection point and arranged so that an antiresonant frequency of the at least one first one-port SAW resonator is outside of the passband of the first SAW filter; and at least one second one-port SAW resonator connected in series between the second SAW filter and the connection point and arranged so that an antiresonant frequency of the at least one second one-port SAW resonator is outside of the passband of the second SAW filter.

13. An electronic component according to claim 12, wherein at least one of the first and second one-port SAW resonators constitutes a plurality of stages connected in series, and a wavelength of an interdigital transducer of at least one of the one-port SAW resonators in the plurality of stages being different from a wavelength of an interdigital transducer of the other one-port SAW resonator in the plurality of stages.

14. An electronic component according to claim 12, further comprising a single piezoelectric substrate, wherein the first and second SAW filters and the first and second one-port SAW resonators are arranged on the single piezoelectric substrate.

15. An electronic component according to claim 11, further comprising an impedance matching inductance element connected to the connection point.

16. An electronic component comprising:

a case;

a surface acoustic wave element provided in the case and including:

a first surface acoustic wave (SAW) filter and a second SAW filter connected to each other in parallel at a connection point which is connected to one of an input terminal and an output terminal of the surface acoustic wave device, the first SAW filter having a capacitive impedance in a passband of the second SAW filter and having a higher passband than that of the second SAW filter and the second SAW filter having a capacitive impedance in the passband of the first SAW filter;

at least one first one-port SAW resonator connected in series between the first SAW filter and the connection point and arranged so that an antiresonant frequency of the at least one first one-port SAW resonator is outside of the passband of the first SAW filter; and at least one second one-port SAW resonator connected in series between the second SAW filter and the connection point and arranged so that an antiresonant frequency of the at least one second one-port SAW resonator is outside of the passband of the second SAW filter.

17. An electronic component according to claim 16, wherein the impedance of the first SAW filter in the passband at an end thereof which is connected to the second SAW filter has, before parallel connection, a resistance component of about 1.2 $Z_0$ or higher with respect to a characteristic impedance $Z_0$ of the surface acoustic wave device, and the impedance of the first SAW filter is higher than the impedance of the second SAW filter in the passband at the end thereof which is connected to the second SAW filter.

18. An electronic component according to claim 16, wherein each of the first and second SAW filters is a longitudinally coupled resonator filter having at least two interdigital transducers.

19. An electronic component according to claim 16, wherein at least one of the first and second one-port SAW resonators constitutes a plurality of stages connected in series, and a wavelength of the interdigital transducer of at least one of the one-port SAW resonators in the plurality of stages being different from a wavelength of the interdigital transducer of the other one-port SAW resonator in the plurality of stages.

20. An electronic component according to claim 16, further comprising a single piezoelectric substrate, wherein the first and second SAW filters and the first and second one-port SAW resonators are arranged on the single piezoelectric substrate.

* * * * *